(12) United States Patent
Ma

(10) Patent No.: US 6,692,279 B1
(45) Date of Patent: Feb. 17, 2004

(54) LAND GRID ARRAY CONNECTOR ASSEMBLY HAVING REINFORCEMENT WITH EAR

(75) Inventor: Hao-Yun Ma, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/443,611

(22) Filed: May 21, 2003

(30) Foreign Application Priority Data

Dec. 13, 2002 (TW) ...................................... 91220209 U

(51) Int. Cl.$^7$ .............................................. H01R 13/62
(52) U.S. Cl. ......................................... 439/331; 439/73
(58) Field of Search ........................ 439/331, 73, 342, 439/330

(56) References Cited

U.S. PATENT DOCUMENTS

| | | |
|---|---|---|
| 5,344,334 A | 9/1994 | Laub et al. |
| 5,482,471 A * | 1/1996 | Mori et al. ................. 439/331 |
| 5,647,756 A * | 7/1997 | Twigg et al. ............... 439/331 |

* cited by examiner

Primary Examiner—Tho D. Ta
(74) Attorney, Agent, or Firm—Wei Te Chung

(57) ABSTRACT

An LGA connector assembly (1) includes an insulative base (10) receiving a multiplicity of contacts (14), a metal reinforcement (11) covering the base, a lever (13) and a metal clip (12). The clip is mounted to one end of the base. The lever includes a pair of locating portions (131) mounted to an opposite end of the base, an offset securing portion (132) between the locating portions engaging the clip, and a medial portion (133) outside the base. The reinforcement includes a top portion (111), and two sidewalls (113) depending perpendicularly from the top portion. An ear aslant extends from an edge of the top portion for orienting the medial portion of the lever at a determined position. Thus, during rotating the lever to engage with or release from the clip, the base and the ear are enough hard to withstand forces from the clip and the lever.

11 Claims, 4 Drawing Sheets

LAND GRID ARRAY CONNECTOR ASSEMBLY HAVING REINFORCEMENT WITH EAR

BACKGROUND OF THE INVENTION

1. Field of the Invention

The present invention relates to land grid array (LGA) connector assemblyies, and particularly to an LGA connector assembly adapted for receiving an LGA central processing unit (CPU) therein and electrically connecting the CPU with a printed circuit board (PCB).

2. Description of the Prior Art

Referring to FIGS. 3 and 4, a conventional LGA connector assembly 9 is adapted for electrically connecting an LGA CPU (not shown) having a multiplicity of metallic contact pads with a PCB (not shown). The LGA connector assembly 9 comprises an insulative base 91 receiving a plurality of electrical contacts 94, and a lever 92 and a metal clip 93 pivotally mounted to two opposite ends of the base 91 respectively.

The lever 92 comprises a pair of locating portions 921, an offset securing portion 922 between the locating portions 921, a medial portion 923 extending perpendicularly from an end of one of the locating portions 921, and a handle portion 924 extending perpendicularly from a free end of the medial portion 923. The clip 93 comprises a lip 931 at a free end thereof, and a pair of mounting portions 932 extending arcuately from an opposite end thereof.

The base 91 is substantially rectangular. The base 91 defines a rectangular cavity 911 in a middle thereof, and has two opposite sidewalls 915. A portion of the base 91 under the cavity 911 defines a plurality of passageways 916, the passageways 916 receiving a corresponding number of the contacts 94 therein. A pair of slots 912 is defined in one end of the base 91. The mounting portions 932 of the metal clip 93 are received in the slots 912 to pivotably mount the clip 93 to the base 91. A trapezoidal recess 913 is defined in an opposite end of the base 91, and a chamber 914 is defined in said opposite end of the base 91 in communication with the recess 913. The locating portions 921 of the lever 92 are pivotably received in the chamber 914, and the securing portion 922 of the lever 92 is received in the recess 913. An ear 917 is formed on one of the sidewalls 915 of the base 91.

In use, the base 91 is mounted to and electrically connected with the PCB. The metal clip 93 and the medial portion 923 of the lever 92 are oriented perpendicular to the base 91, with the securing portion 922 disposed above the locating portions 921. The CPU is mounted in the cavity 911, and the metallic contact pads of the CPU are loosely attached on the corresponding contacts 94 of the base 91. Then the metal clip 93 is rotated down to loosely contact the CPU. The handle portion 924 of the lever 92 is rotated downwardly, thus rotating the medial portion 923 downwardly. When the securing portion 922 reaches the lip 931 of the clip 93, it engages the lip 931 and drives the lip 931 downwardly. When the medial portion 923 reaches a top of the ear 917 of the base 91, the handle portion 924 is rotated further downwardly until the medial portion 923 is engaged under the ear 917. The ear 917 thus holds the medial portion 133 at a horizontal position. In this position, the securing portion 922 of the lever 92 tightly presses on the lip 931, which in turn tightly presses the metallic contact pads of the CPU on the contacts 64. The LGA connector assembly 9 thus electrically connects the CPU with the PCB.

Conversely, when the handle portion 924 of the lever 92 is rotated upwardly from the horizontal position, the medial portion 923 is released from the ear 917 of the base 91. The handle portion 924 is continued to be rotated upwardly, and the securing portion 922 of the lever 92 releases from the lip 931 of the clip 93. When the medial portion 923 has reached the position perpendicular to the base 91, the clip 93 can be rotated up to the perpendicular position, and the CPU can be taken out from the cavity 911 of the base 91.

At present, with the prevailing trend toward miniaturization of computers, the sizes of LGA connector assemblies used in computers are steadily becoming smaller. In contrast, the number of contacts used in LGA connectors is increasing to meet the need for more signal transmission. These considerations bear on the conventional LGA connector assembly 9 as follows. During the rotation of the lever 92 to force the metallic contact pads of the CPU on the contacts 94 of the base 91, the metal clip 93 and the lever 92 exert forces on the base 91. The forces acting on portions of the base 91 near the slots 912 and at the chamber 914 are greater than those acting on other portions of the base 91. Therefore the base 91 is liable to deform and warp. When deformation or warpage occurs, some contacts 94 cannot firmly contact the metallic contact pads of the CPU, which disrupts the electrical connection between the CPU and the PCB.

In addition, during the above-described operations, the medial portion 923 of the lever 92 exerts force upon the ear 917 of the base 91. The ear 917 is relatively thin, and is typically made of insulative material such as plastic. Thus, the ear 917 is liable to be broken when the lever 92 is operated repeatedly over time. When the ear 917 is broken, the lever 92 cannot be retained at the horizontal position. Instead, the lever 92 accidentally rotates up from the horizontal position, leaving the metallic contact pads of the CPU only loosely engaged with the contacts 94. This easily leads to disruption of the electrical connection between the CPU and the PCB.

In view of the above, a new LGA connector assembly that overcomes the above-mentioned disadvantages is desired.

SUMMARY OF THE INVENTION

Accordingly, an object of the present invention is to provide a land grid array (LGA) connector assembly for electrically connecting an electronic package such as an LGA central processing unit (CPU) with a circuit substrate such as a printed circuit board (PCB), wherein the LGA connector assembly has a base that resists deformation and warpage.

Another object of the present invention is to provide an LGA connector assembly which has a lever and an ear for reliably retaining the lever, the ear being configured to resist breakage even after repeated operation of the lever.

To achieve the above-mentioned objects, an LGA connector assembly in accordance with a preferred embodiment of the present invention comprises an insulative rectangular base receiving a multiplicity of electrical contacts, a metal reinforcement covering the base, a lever and a metal clip. The base defines a cavity in a middle thereof, and a plurality of holes near the cavity. The clip is mounted to one end of the base. The lever comprise a pair of locating portions received in an opposite end of the base, an offset securing portion between the locating portions engaging the clip, and a medial portion extending perpendicularly from an end of one of the locating portion. The reinforcement comprises a top portion, and two opposite sidewalls depending perpendicularly from the top portion. An ear is formed at one of the sidewalls for orienting the medial portion of the lever. Eight projecting members depend perpendicularly from the top portion. Each projecting member is fittingly received in the corresponding hole of the base. Thus, during rotating the lever to tightly attach a CPU in the cavity of the LGA connector assembly or release the CPU from the contacts, the base and the ear are enough hard to withstand forces from the clip and the lever.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
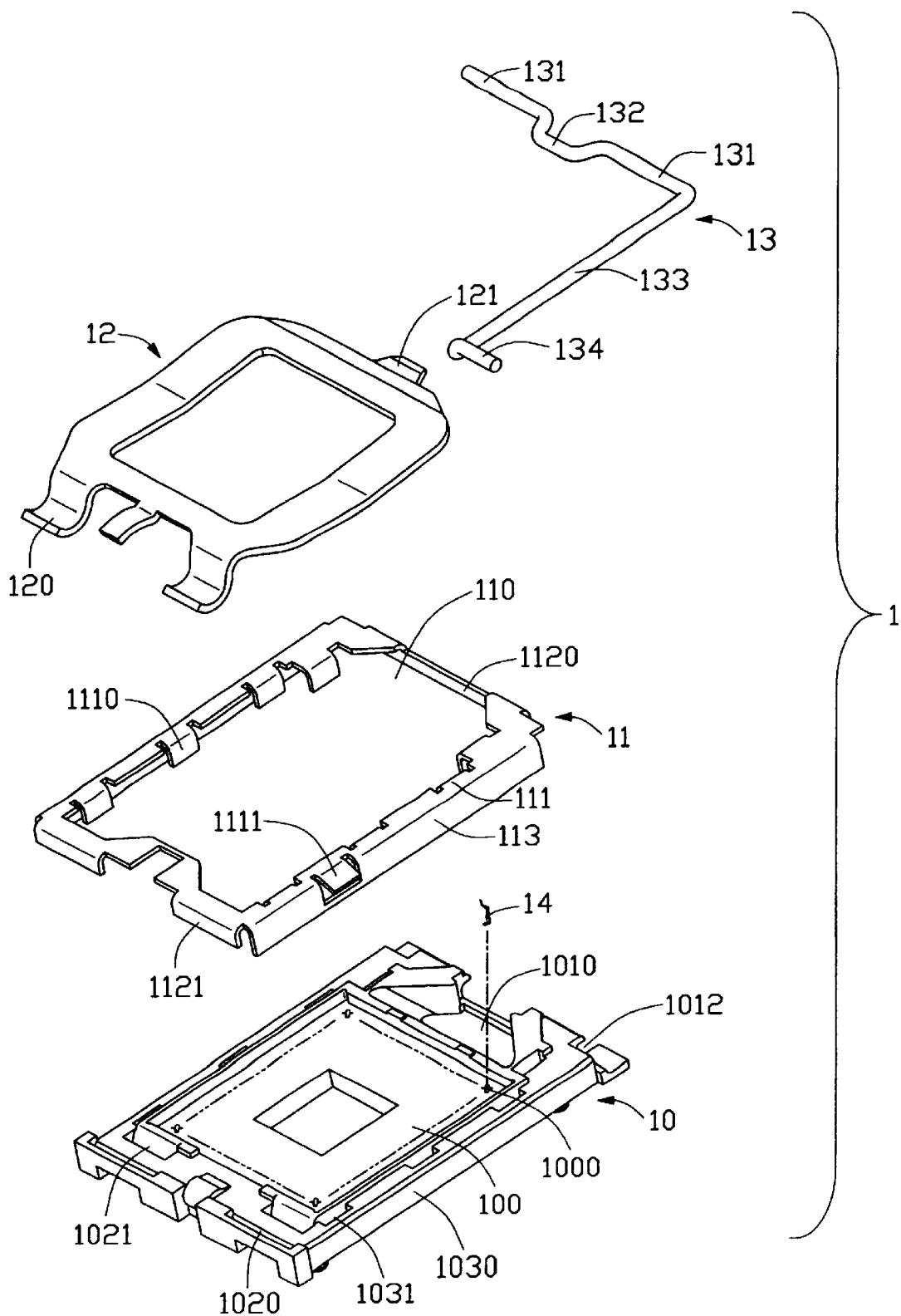
FIG. 1 is an exploded, isometric view of an LGA connector assembly in accordance with the preferred embodiment of the present invention.

Referring to FIG. 1, a land grid array (LGA) connector assembly I in accordance with the preferred embodiment of the present invention is adapted for electrically connecting an electronic package such as an LGA central processing unit (CPU) (not shown) with a circuit substrate such as a printed circuit board (PCB) (not shown).

The LGA connector assembly 1 comprises an insulative base 10, a multiplicity of electrical contacts 14 received in the base 10, a metal reinforcement 11 covering the base 10, and a metal clip 12 and a lever 13 pivotally mounted to two opposite ends of the base 10 respectively.

The lever 13 comprises a pair of locating portions 131, an offset securing portion 132 between the locating portions 131, a medial portion 133 extending perpendicularly from an end of one of the locating portions 131, and a handle portion 134 extending perpendicularly from a free end of the medial portion 133.

The clip 12 comprises a lip 121 at a free end thereof, and a pair of spaced mounting portions 120 extending arcuately from an opposite end thereof.

Figure 2:
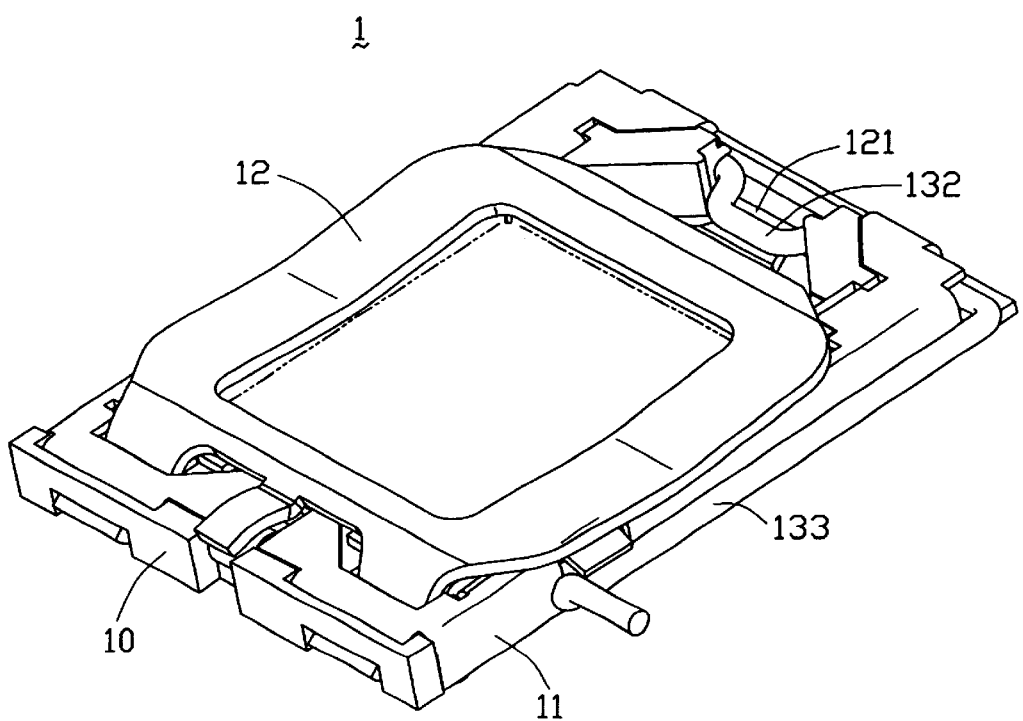
FIG. 2 is an assembled view of FIG. 1.
Figure 3:
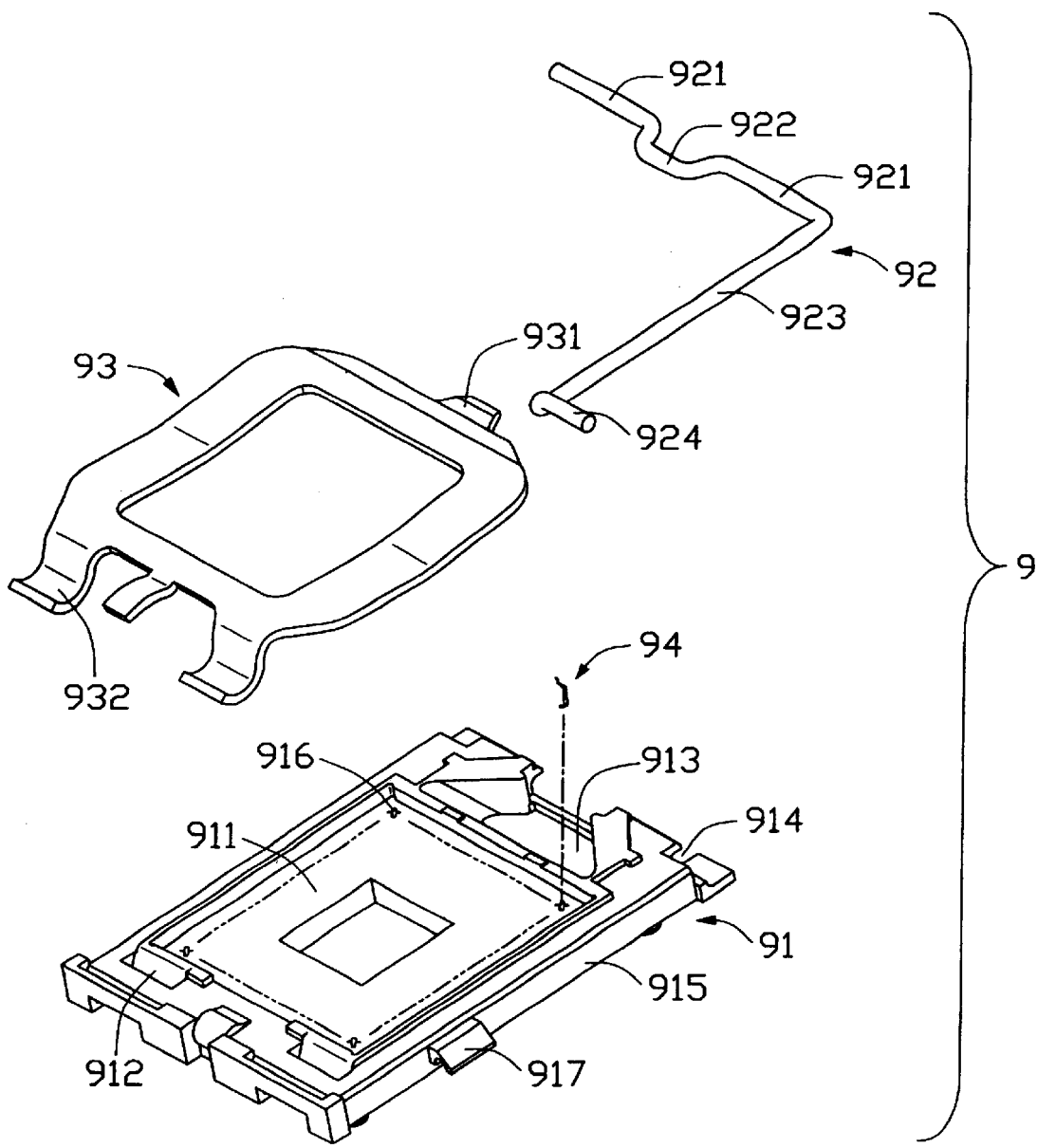
FIG. 3 is an exploded, isometric view of a conventional LGA connector assembly.
Figure 4:
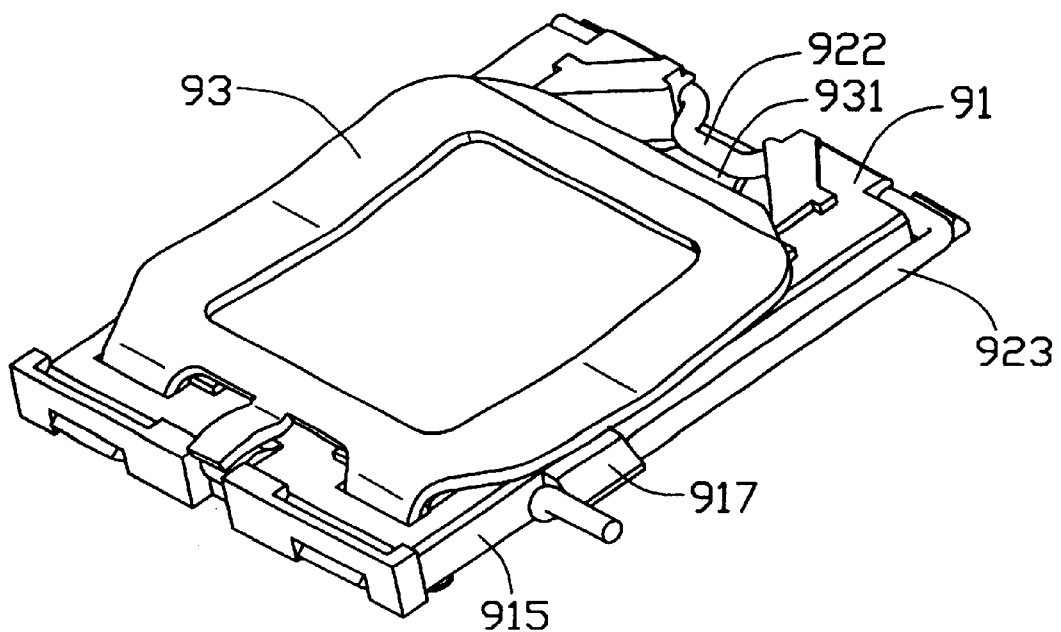
FIG. 4 is an assembled view of FIG. 3.

Also referring to FIG. 2, the base 10 is substantially rectangular. The base 10 defines a rectangular cavity 100 in a middle thereof, a pair of spaced, aligned channels 1020 in one end thereof, and a trapezoidal recess 1010 in an opposite end thereof. The base 10 has a pair of opposite lateral sides 1030. A portion of the base 10 under the cavity 100 defines a multiplicity of passageways 1000 receiving a corresponding number of electrical contacts 14 therein. A pair of spaced, aligned slots 1021 is defined between the channels 1020 and the cavity 100, the slots 1021 receiving the mounting portions 120 of the clip 12 therein to pivotally mount the clip 12 to the base 10. A chamber 1012 is defined in said opposite end of the base 10 in communication with the recess 1010. The locating portions 131 of the lever 13 are received in the chamber 1012, and the securing portion 132 of the lever 13 is received in the recess 1010. Eight rectangular holes 1031 are respectively defined in two opposite sides of the base 10, near the cavity 100.

The reinforcement 11 is stamped and formed from a sheet of metallic material. The reinforcement 11 comprises a top portion 111 parallel to a top of the base 10. The top portion 111 defines an opening 110 in a middle thereof, corresponding to the cavity 100 of the base 10. The opening 110 and the cavity 100 enable receipt of the CPU in the base 10. Two opposite sidewalls 113 depend perpendicularly from two opposite lateral edges of the top portion 111, for covering the lateral sides 1030 of the base 10. One of the sidewalls 113 has a slanted ear 1111 extending from the top portion 111, for orienting the medial portion 133 of the lever 13. Two spaced tabs 1121 depend perpendicularly from an end of the top portion 111. The tabs 1121 are received in the channels 1020 of the base 10. A beam 1120 depends perpendicularly from an opposite end of the top portion 111. The beam 1120 blocks an end opening of the chamber 1012, thereby retaining the locating portions 131 of the lever 13 in the chamber 1012 and the securing portion 132 of the lever 13 in the recess 1010. Eight projecting members 1110 depend perpendicularly from inner lateral edges of the top portion 111, corresponding to the holes 1031 of the base 10. Each projecting member 1110 is fittingly received within the corresponding hole 1031, thereby mounting the reinforcement 11 to the base 10.

In use, the LGA connector assembly 1 is mounted to and electrically connected with the PCB. The clip 12 and the medial portion 133 of the lever 13 are each oriented perpendicular to the base 10, with the securing portion 132 of the lever 13 disposed above the locating portions 131. The CPU is mounted in the cavity 100, with metallic contact pads (not shown) of the CPU loosely attached on the contacts 14 of the LGA connector assembly 1. The clip 12 is rotated downwardly to loosely contact the CPU. The handle portion 134 of the lever 13 is rotated downwardly, thus rotating the securing portion 132 downwardly. When the securing portion 132 reaches the lip 121 of the clip 12, it engages the lip 121 and drives the lip 121 downwardly. When the medial portion 133 of the lever 13 reaches a top of the ear 1111, the handle portion 134 is rotated further downwardly until the medial portion 133 is engaged under the ear 1111. The ear 111 thus holds the medial portion 133 at a horizontal position. In this position, the securing portion 132 tightly presses on the lip 121, which in turn tightly presses the metallic contact pads of the CPU on the contacts 14. The LGA connector assembly 1 thus electrically connects the CPU with the PCB reliably.

Conversely, when the handle portion 134 of the lever 13 is rotated upwardly from the horizontal position, the medial portion 133 is released from the ear 1111 of the base 10. The handle portion 134 is continued to be rotated upwardly, and the securing portion 132 of the lever 13 releases from the lip 121 of the clip 12. When the medial portion 133 has reached the position perpendicular to the base 10, the clip 12 can be rotated up to the perpendicular position, and the CPU can be taken out from the cavity 100 of the base 10.

As can be seen from FIG. 2, the reinforcement 11 covers portions of the base 10 near the slots 1021 and the chamber 1012. Thus, when the lever 13 and the clip 12 are driven downwardly, even though said portions of the base 10 sustain greater forces from the clip 12 than other portions of the base 10, the base 10 is able to withstand such forces. As a result, the base 10 resists deformation or warpage, and the LGA connector assembly 1 electrically connects the CPU with the PCB reliably. In addition, the ear 1111 is made of metallic material. Thus, the ear 1111 is strong enough to withstand force exerted from the medial portion 133 of the lever 13, even after repeated operation of the lever 13.

While a preferred embodiment in accordance with the present invention has been shown and described, equivalent modifications and changes known to person skilled in the art according to the spirit of the present invention are considered within the scope of the present invention as defined in the appended claims.

What is claimed is:

1. A land grid array (LGA) connector assembly, comprising
    an insulative base defining a cavity in a middle thereof;
    a metal reinforcement covering the base, the reinforcement comprising a top portion defining an opening in a middle thereof corresponding to the cavity of the base, and an ear aslant extending from the top portion;
    a lever pivotally mounted to one end of the base, the lever comprising a securing portion and a medial portion outside the base for engaging with the ear;
    a clip pivotally mounted to an opposite end of the base for engaging with the securing portion.

2. The LGA connector assembly as claimed in claim 1, wherein the base defines a plurality of holes near the cavity, and the reinforcement comprises a corresponding number of projecting members depending perpendicularly from inner lateral edges of the top portion for engaging with the holes.

3. The LGA connector assembly as claimed in claim 1, wherein two spaced tabs depend perpendicularly from an end of the top portion of the reinforcement, and an elongate beam depends perpendicularly from an opposite end of the top portion.

4. The LGA connector assembly as claimed in claim 3, wherein the base defines a pair of spaced, aligned channels in one end thereof for receiving the tabs therein.

5. The LGA connector assembly as claimed in claim 3, wherein the base defines a chamber in an opposite end thereof for receiving the lever therein, and the beam of the reinforcement blocks an end opening of the chamber to hold the lever within the chamber.

6. The LGA connector assembly as claimed in claim 5, wherein the base defines a recess in said opposite end thereof in communication with the chamber for receiving the securing portion of the lever.

7. The LGA connector assembly as claimed in claim 1, wherein the reinforcement comprises two opposite sidewalls depending perpendicularly from two opposite lateral edges of the top portion.

8. The LGA connector assembly as claimed in claim 1, wherein the clip has a lip at a free end thereof for engaging with the securing portion of the lever.

9. The LGA connector assembly as claimed in claim 1, wherein the clip has a pair of mounting portions extending arcutately from an end thereof.

10. The LGA connector assembly as claimed in claim 9, wherein the base defines a pair of slots in an end thereof for engaging with the mounting portions of the clip.

11. An electrical connector comprising:
    an insulative base defining a middle region for contacting an electronic package, and a periphery region surrounding said middle region;
    a frame-like metal reinforcement covering the base and including a top portion generally located upon the periphery region; and
    a lever pivotally mounted unto an end of said base for holding said electronic package in position on the base; wherein
    said lever includes an operation portion up and down moveable relative to the base for holding and releasing the electronic package, and wherein
    said operation portion is latchably engaged with a locking ear which integrally extends from said reinforcement, when said lever is in a locked position a clip pivotally mounted to an opposite end of the base for engaging with a securing portion of the lever.

* * * * *